(12) United States Patent
Marshall et al.

(10) Patent No.: US 6,358,430 B1
(45) Date of Patent: Mar. 19, 2002

(54) TECHNIQUE FOR ETCHING OXIDES AND/OR INSULATORS

(75) Inventors: Daniel Scott Marshall, Chandler; Lucia R. Salem, Gilbert; Harland G. Tompkins, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/362,251

(22) Filed: Jul. 28, 1999

(51) Int. Cl.[7] .............................................. B44C 1/22
(52) U.S. Cl. .............................. 216/87; 316/37; 316/13; 438/958
(58) Field of Search ............................ 216/13, 66, 87, 216/37; 438/720, 958

(56) References Cited

U.S. PATENT DOCUMENTS

| | | | | |
|---|---|---|---|---|
| 3,808,068 | A | * 4/1974 | Johnson et al. | 216/87 |
| 4,597,825 | A | 7/1986 | Freeouf et al. | 156/643 |
| 5,201,989 | A | * 4/1993 | Douglas et al. | 216/87 |
| 5,238,529 | A | * 8/1993 | Douglas | 216/87 |
| 5,385,633 | A | 1/1995 | Russell et al. | 156/693 |
| 5,643,472 | A | 7/1997 | Engelsberg et al. | 216/65 |
| 5,741,431 | A | 4/1998 | Shih | 216/65 |
| 5,824,206 | A | 10/1998 | Quinlan | 205/646 |

OTHER PUBLICATIONS

"Laser–Induced Chemistry for Microelectronics", Osgood et al., *Science*, Feb. 15, 1985, pp. 709–714.
"Localized Laser Etching of Compound Semiconductors in Aqueous Solution", Osgood et al., *Appl. Phys. Lett.* 40(5), Mar. 1, 1982, pp. 391–393.
"A Review of Laser–Microchemical Processng", Ehrlich et al., *J. Vac. Sci. Technol.. B* 1(4), Oct.–Dec. 1983, pp. 969–984.
"Laser–Induced Microscopic Etching of GaAs and InP", Ehrlich et al., *Appl. Phys. Lett.* 36(8), Apr. 15, 1980, pp. 698–700.
"Patterned, Photo–Driven Cryoetching of GaAs and AIGaAs", Shih et al., *J. Vac. Sci. Technol. B13(1)*, Jan./Feb. 1995, pp. 43–54.
"Conference on Lasers and Electo– Optics". *1988 Technical Digest Series*, vol. 7, 3 pages.
"Science and Technology of Microfabrication", Howard et al., Materials Research Society Symposia Proceedings, vol. 76, pp. 147–156.
"In–Situ Patterning: Selective Area Deposition and Etching", Bernhardt et al., Materials Research Society Symposium Proceedings, vol. 158, pp. 325–330.
"Laser–Induced Chemical Etching of Silicon in Chlorine Atmosphere", Mogyorosi et al., *Appl. Phys. A 45*, pp. 293–299.
"Deep UV Photochemistry of Chemisorbed Monolayers: Patterned Coplanar Molecular Assemblies", Dulcey et al., *Science*, Apr. 26, 1991, pp. 551–554.
"Particle Removal From Semiconductor Surfaces Using a Photon–Assisted, Gas–Phase Cleaning Process", Audrey C. Englesberg, Mat.Res.Soc. Symp. Proc., vol. 315, pp. 255–260.

(List continued on next page.)

Primary Examiner—Frankie L. Stinson
Assistant Examiner—Shamim Ahmed
(74) *Attorney, Agent, or Firm*—William E. Koch

(57) ABSTRACT

A method of etching a layer of electrical insulating material including a layer of strontium titanate on a surface of a semiconductor substrate. The layer of strontium titanate is immersed in a passivated etching solution including an acid and HF and focused light is directed onto the surface of the layer of strontium titanate at areas to be etched, so as to depassivate the passivated surface and to etch the layer of strontium titanate only at the surface receiving collimated light. In a preferred embodiment, the passivated etching solution includes HCl and less than 1000 ppm of HF.

31 Claims, 1 Drawing Sheet

OTHER PUBLICATIONS

"Laser Enhanced Etching in KOH", von Gutfeld et al., *Appl. Phys. Lett. 40(4)*, Feb. 15, 1982, pp. 352–354.

"Photon–Assisted Dry Etching of GaAs", Brewer et al., *Appl. Phys. Lett 45(4)*, Aug. 15, 1984, pp. 475–477.

"Proceedings of the Symposium on Dry Process", Nishizawa et al., *Electronics and Dielectrics and Insulation Divisions*, vol. 88–7, pp. 271–278.

"Design and Results for a 345 GHz SIS Focal Plane Array Using Planar Technology", Legg et al., *International Journal of Infrared and Millimeter Waves*, vol. 17, Nov. 1, 1996, pp. 79–90.

"The Photoelectrochemical Oxidation of (100), (111), and (111) n–InP and n–GaAs", Kohl et al., Bell Laboratories, pp. 2288–2293.

"p–InP Photoetching", Kohl et al., School of Chemical Engineering, Georgia Institute of Technology, pp. 3315–3316.

"The Photoelectrochmical Etching of (100) and (111) p–InP", Kohl et al., School of Chemical Engineering, Georgia Institute of Technolollgy, pp. 608–614.

"The Photoelectrochemical Oxidation of n–Si in Anhydrous HF–Acetonitrile", Propst et al, School of Chemical Engineering, Georgia Institute of Technology, pp. L78–L80.

"Photoelectrochemical Etching of InAs", Harris et al., School of Chemical Engineering, Georgia Institute of Technology, pp. 1274–1277.

"Photoelectrochemical Etching of GaSb", Propst et al., School of Chemical Engineering, Georgia Institute of Technology, pp. 3631–3635.

"Effect of Photochemical Etching on Interface State Density of $Ga_{0.47}In_{0.53}As$ Metal/Insulator Semiconductor Diodes", Aoki et al., May 26, 1987.

"Mechanism of (111) Silicon Etching in HF–Acetonitrite", Rieger et al., Georgia Institute of Technology, *J. Electrochem Society*, vol. 142, No. 5, May 1995, pp. 1490–1495.

"Using Focused Ion Beam Damage Patterns to Photoelectrochemically Etch Features in III–V Materials", Cummings et al., *Appl. Phys. Lett 48(10)*, Mar. 10, 1986, pp. 659–661.

"Improvements in the Modulation Amplitude of Submicron Gratings Produced in n–Inp by Direct Photoelectrochemical Etching", Lum et al., *Appl. Phys. Lett 47(3)*, Aug. 1, 1985, pp. 269–271.

"Photoelectrochemical Etching of Integral Lenses on InGaAsP/InP Light–Emitting Diodes", Ostermayer et al., *Appl. Phys. Lett 43(7)*, Oct. 1, 1983, pp. 642–644.

"Photoelectrochemical Etching of p–GaAs", Ostermayer et al., Appl. Phys. Lett. 39(1), Jul. 1, 1981, pp. 76–78.

The Influence of Aluminum Concentration on Photoelectrochemical Etching of First Order Gratings in GaAs/AIGaAs, Twyford et al., Appl. Phys. Lett. 67(9), Aug. 28, 1995, pp. 1182–1184.

\* cited by examiner

TECHNIQUE FOR ETCHING OXIDES AND/OR INSULATORS

FIELD OF THE INVENTION

The present invention pertains to etching electrical insulators and more specifically to etching electrical insulators, such as oxides, on semiconductor surfaces.

BACKGROUND OF THE INVENTION

A major technique used today, and especially in the semiconductor industry, is to deposit or grow a layer of material and then etch away unwanted portions. In general, etching processes can be performed by wet or dry etching procedures. Typically, wet chemistry produces far too much undercutting (i.e. horizontal etching) and is, therefore, not considered for the desired applications. However, some materials are difficult to etch with dry chemistries. Sometimes these materials can be etched, but with little selectivity between the material being etched and the material which is to remain.

Using Reactive Ion Etching (RIE), it is difficult to etch materials that contain elements that are either very high mass (such as Ba, Sr, Pt, etc.) or highly reactive (such as (Ba, Sr, Ca, etc.). Finding volatile byproducts that can be formed during the RIE process is the key to etch selectivity. It is very difficult to etch earth metal oxides (e.g. $SrTiO_3$, $BaTiO_3$, and $BaSrTiO_3$) in a reactive ion etcher because Sr and Ti don't make volatile byproducts. So far, the solution has been to use a largely physical etch condition with little or no selectivity. At present, gas chemistry is inferior for these high dielectric constant (high K) materials.

The desired etch characteristics are vertical sidewalls (large differential etch rates), reasonable etch rates, and high chemical selectivity to other materials that are not to be etched. Vertical sidewalls greater than approximately 80° and selectivity greater than 3–4 are fairly common. By using a high "physical" component to the RIE etch (e.g. sputtering), near vertical sidewalls are achievable, however, chemical selectivity suffers.

It is desirable, therefore, to provide a new method of etching to solve these problems. The most desirable ingredients are: etch selectivity (vertical); etch selectivity (horizontal); and anisotropy. In a specific application the etching of earth metal oxides (including barium titanate, barium strontium titanate, or strontium titanate) which is deposited directly on silicon is desirable. Further, during the etching, any strontium titanate under a gate electrode should remain.

It is an object of the present invention to provide a new and improved method of etching electrical insulators.

It is another object of the present invention to provide a new and improved method of etching electrical insulators and specifically oxides.

It is still another object of the present invention to provide a new and improved method of etching electrical insulators with improved vertical etch selectivity, horizontal etch selectivity, and anisotropy.

It is yet another object of the present invention to provide a new and improved method of etching electrical insulators with improved etch rates.

It is a further object of the present invention to provide a new and improved method of etching earth metal oxides, including $SrTiO_3$, $BaTiO_3$ or $BaSrTiO_3$, and more specifically a new and improved method of etching earth metal oxides, and more specifically strontium titanates, on silicon.

SUMMARY OF THE INVENTION

The above objects and others are realized and the above problems and others are at least partially solved by a method of etching a layer of electrical insulating material in which a layer of electrical insulating material on a supporting surface, such as a semiconductor substrate, is immersed in an etching solution, while using a passivating material at the surface of the layer of electrical insulating material to prevent the etching solution from operating on the electrical insulating material, and directing light onto the surface of the layer of electrical insulating material at areas to be etched, so as to depassivate the passivating material and to etch the layer of electrical insulating material only at the surface receiving the light. A focused pattern or a light-stopping mask layer can be used to direct light. Further, a mixed solution is provided in which a passivating agent is present along with an etching agent. The passivating agent prevents the etching while no light (preferably UV light) is directed at the surface or in areas that the light does not reach. When (UV) light is directed at the surface, the surface passivation is disrupted and etching takes place.

The above objects and others are further realized and the above problems and others are at least partially solved by a more specific, preferred method of etching a layer of electrical insulating material in which a thin layer of strontium titanate is provided on a surface of a semiconductor substrate and an acid solution containing less than 1000 ppm of HF is used as the passivated etching solution. The layer of strontium titanate is immersed in the passivated etching solution and collimated light is directed onto the passivated surface of the layer of strontium titanate at areas to be etched. The collimated light depassivates the passivated surface of the strontium titanate and the passivated etching solution etches the layer of strontium titanate only at the surface receiving collimated light.

BRIEF DESCRIPTION OF THE DRAWINGS

Referring to the drawings.

DESCRIPTION OF THE PREFERRED EMBODIMENT

As described briefly above, it is desirable to provide a new method of etching to solve the various problems prevalent in today's technology. The most desirable ingredients of the etching method are: vertical etch profile; horizontal etch control; (anisotropy) and etch selectivity to other materials with respect to the material to be etched. In a specific application the etching of strontium titanate (including barium, strontium titanate) which is deposited directly on silicon is desirable. Also, during the etching, any strontium titanate under a gate electrode should remain, i.e. very little or no horizontal etching. Further, very little etching of other materials, such as Si, $SiO_2$, and $Si_3N_4$, should occur in this solution, even when illuminated by light.

Figure 1:
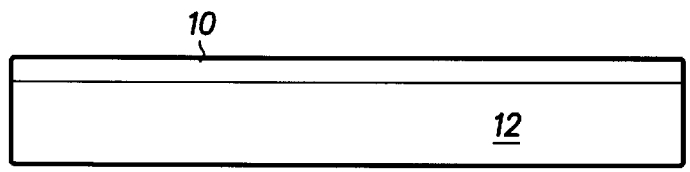
FIG. 1 is a simplified cross-sectional view of a layer of electrical insulating material on a supporting surface.

Turning now to the drawings, FIG. 1 illustrates a layer 10 of electrical insulating material on a supporting surface 12, which in this specific example is a layer of strontium titanate on a silicon substrate (e.g. a silicon wafer). Here it should be understood that layer 10 can be any insulating material which is otherwise difficult to etch and, specifically, the insulating material of layer 10 includes oxides and/or high mass materials, such as Ba, St, Pt, etc., and/or highly reactive materials, such as Ba, Sr, Ca, etc.

Figure 2:
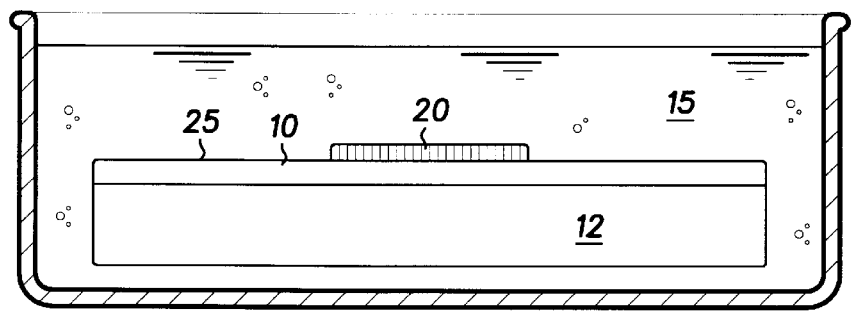
FIG. 2 is a simplified cross-sectional view of the structure of FIG. 1 immersed in a passivated etching solution.

Referring to FIG. 2, the layer 10 of electrical insulating material on supporting surface 12 is immersed in a passivated etching solution 15, that is a solution which contains a passivating material which prevents etching solution 15 from operating on layer 10. Typically, etching solution 15 includes an etchant or etching material, such as an acid which may be, for example, an acid solution including one of HCl, $H_2SO_4$, $HNO_3$, and $HPO_3$. Etching solution 15, in accordance with the present invention, further includes a passivating material, which is any material that passivates the surface of layer 10 to prevent the etchant or etching material from etching layer 10 prior to the application of light, as will be explained in more detail presently.

A mask 20 is positioned on surface 25 of layer 10 so as to shade all areas which are not to be etched. Here it should be understood that mask 20 can be a hard mask formed directly on surface 25 of layer 10 by any of the well known photolithographic techniques, or it can be a simple shadow mask positioned adjacent to layer 10, or any other structure for preventing light from impinging upon areas of surface 25 which are not to be etched. It will of course be understood that mask 20 should be formed of material which will not be etched by etching solution 15, if it is positioned in etching solution 15.

In a specific example of the present method of etching an electrical insulating material, supporting surface 12 is a semiconductor material, such as silicon or a silicon containing material and layer 10 is an oxide, for example an alkaline earth oxide such as strontium titanate. Etching solution 15 includes an acid, in this specific example HCl, and a passivating material, which in this specific example is HF. The HF passivates the etching process so that substantially no etching occurs by simply immersing supporting surface 12 and layer 10 into passivated etching solution 15. To passivate surface 25, it has been found that less than approximately 1000 parts per million (ppm), and preferably approximately 50 ppm, of HF in the solution (e.g. in an etch solution of 12.4 Molar HCl) provides the passivation required. Here it should be noted that a relatively small amount (e.g. generally several monolayers or less than 10 Å) of etching will occur after the initial introduction of supporting surface 12 and layer 10 into passivated etching solution 15. However, this etching stops after the initial small etch and does not continue.

Figure 3:
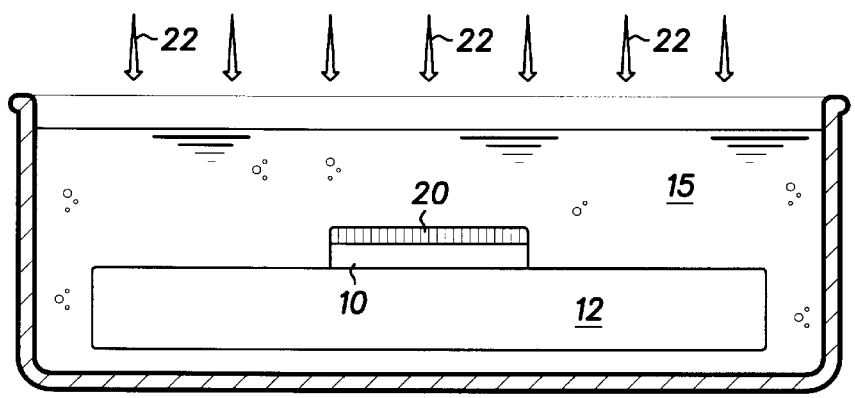
FIG. 3 is a simplified cross-sectional view of the structure of FIG. 2 with collimated light applied to depassivate the passivated surface and to etch the layer of electrical insulating material only at the surface receiving collimated light.
Figure 4:
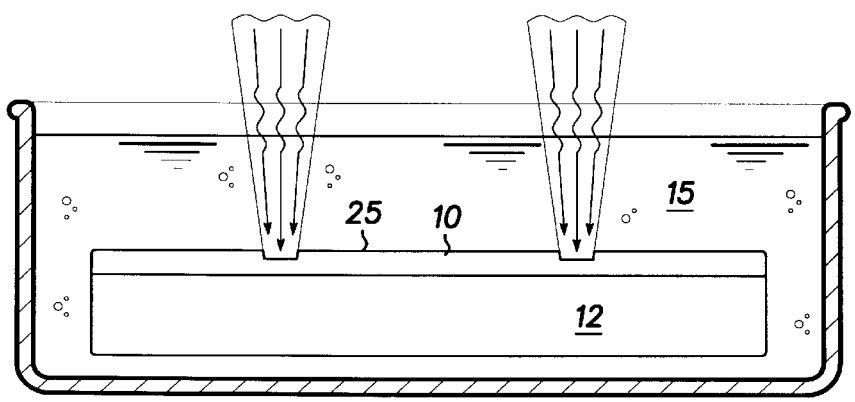
FIG. 4 illustrates a focused pattern of light with etching occurring only in illuminated areas.

To initiate the etching process, light (represented by arrows 22 in FIG. 3) is directed onto surface 25 of layer 10 to be etched. It is preferred that the light at least include ultra violet (UV) light with an energy approximately equal to or greater than the bandgap of the material to be etched. The light also may be tailored to the excitation energy of the passivation bonded to the surface. In a preferred embodiment the light is focused or collimated to be sure that no light inadvertently strikes the sidewalls or other areas which are not to be etched. However, in many applications simply using mask 20 positioned directly on surface 25 and a reasonably directable light source may be sufficient to achieve the desired purposes. While a naturally collimated light source is available by using a laser, light sources, such as light that is at least partially collimated or focused by lenses and apertures, can be used (e.g. stepper light with a reticle mask). An example of the use of a focused pattern of light is illustrated in FIG. 4. Mercury Arc lamps that are lensed and filtered are preferred for their low cost and high intensity in the UV range. Directing the collimated light onto the surface of layer 10 at areas to be etched, depassivates surface 25 and etching of layer 10, only at the areas receiving collimated light, begins and continues as long as the light is present.

A solution of straight HCl (12.4 Molar HCl solution) as the etchant generally etches at a rate of 10 Å to 15 Å per minute. In the present process, substantially no etching occurs (except for the small initial etch described above) until the light is applied, after which electrical insulating layer 10 is etched at a rate of greater than 50 Å per minute, and generally in a range of 50 Å to 100 Å per minute. Thus, by determining the etch rate in the specific electrical insulating material being etched the depth of the etch can be accurately controlled with the light. Further, because the light is directed only onto the upper surface (initially surface 25) of layer 10 (even as the etch progresses) substantially no horizontal etching occurs and the sidewalls are substantially vertical with no undercutting. Further, the high selectivity of strontium titanate, for example, over Si, $SiO_2$ and other materials allows a large overetch. This overetch allows for areas that are thicker or etch more slowly, to be completely etched while those areas that have already etched through are essentially unaffected by the additional etchant and light exposure.

In applications where the very small initial etch, that is the several monolayers or less than 10 ∈ described above, cannot be tolerated (e.g. structures in which the layer to be etched is less than approximately 20 Å), the structure can be prepassivated before dipping into passivated etching solution 15. This initial passivation or prepassivation can be accomplished by dipping the structure to be etched into a prepassivating solution, which in the specific example described above is water and less than 1000 ppm of HF. The time between prepassivation and etching is not believed to be critical, i.e. some time (even days) can pass. It is believed that the prepassivating solution forms an initial passivating layer on the surface of the layer to be etched (e.g. layer 10) and, once the structure is immersed in the passivated etching solution and light is applied, the layer goes into the etching solution. Because of the prepassivation, the initial small etch does not occur and no etching takes place until light is applied. Here it should be noted that any passivation material can be used in either the prepassivation or the passivated etching solutions described above. While HF is used in the specific example, many other materials, such as any organic material, will operate as an etch inhibitor or passivation material in the present process.

Thus, a new and improved method of etching electrical insulators, and specifically oxides, is disclosed. The new and improved method of etching electrical insulators has improved vertical etch profile, horizontal etch control, (anisotropy) and etch selectivity to other materials with respect to the material to be etched. Further, the new and improved method of etching electrical insulators provides an improved etch rate. In the preferred embodiment, the new and improved method of etching is used to etch alkaline earth oxides (including $SrTiO_3$, $BaTiO_3$ and $BaSrTiO_3$) on semiconductor substrates including silicon and uses an HCl etching solution with HF as the passivating material.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of etching a layer of electrical insulating materaial comprising the steps of:
   providing a layer of electrical insulating material on a supporting surface;
   providing a passivated etching solution;
   immersing the layer of electrical insulating material in the passivated etching solution wherein the passivated etching solution contains less than 1000 parts per million of HF as a passivating material at a surface of the layer of electrical insulating material to prevent the passivated etching solution from operating on the electrical insulating material; and
   directing light onto the surface of the layer of electrical insulting material at areas to be etched, so as to depassivate the surface and to etch the surface of the layer of electrical insulating material only at the areas receiving light.

2. A method etching a layer of electrical insulating material as claimed in claim 1 further including the step of passivating the surface by dipping the surface in a solution of a passivating material prior to immersing the layer of electrical insulating material in the passivated etching solution.

3. A method of etching a layer of electrical insulating material as claimed in claim 1 wherein the step of providing the layer of electrical insulating material includes providing a layer of oxide.

4. A method of etching a layer of electrical insulating material as claimed in claim 3 wherein the step of providing the layer of oxide includes providing an alkaline earth oxide.

5. A method of etching a layer of electrical insulating material as claimed in claim 3 wherein the step of providing the layer of oxide includes providing a layer including a titanate.

6. A method of etching a layer of electrical insulating material as claimed in claim 5 wherein the step of providing the layer including the titanate includes providing a layer including one of $SrTiO_3$, $BaTiO_3$ and $BaSrTiO_3$.

7. A method of etching a layer of electrical insulating material as claimed in claim 1 wherein the step of providing the layer of electrical insulating material on a supporting surface includes providing an electrical insulating layer on a semiconductor surface.

8. A method of etching a layer of electrical insulating material as claimed in claim 1 wherein the step of providing a passivated etching solution includes providing an acid solution as the etchant.

9. A method of etching a layer of electrical insulating material as claimed in claim 8 wherein the step of providing the acid solution includes providing an acid solution including one of HCl, $H_2SO_4$, $HNO_3$, and $HPO_3$.

10. A method of etching a layer of electrical insulating material as claimed in claim 1 wherein the passivated etching solution contains between 10–100 parts per million of HF as the passivating material.

11. A method of etching a layer of electrical insulating material as claimed in claim 1 wherein the step of directing light onto a surface of the layer includes directing collimated light onto the layer.

12. A method of etching a layer of electrical insulating material as claimed in claim 1 wherein the step of directing light onto the surface of the layer includes positioning a mask over portions of the layer which are not to be etched.

13. A method of etching a layer of electrical insulating material as claimed in claim 12 wherein the step of positioning the mask over portions of the layer which are not to be etched includes forming a hard mask on the surface of the layer.

14. A method of etching a layer of electrical insulating material as claimed in claim 12 wherein the step of positioning the mask over portions of the layer which are not to be etched includes focusing stepper light with a reticle mask.

15. A method of etching a layer of oxide comprising the steps of:
   providing a layer of oxide on a surface of a semiconductor substrate;
   providing a passivated etching solution including an etchant and passivating material wherein the passivated etching solution contains less than 1000 parts per million of HF;
   immersing the layer of oxide in the passivated etching solution to passivate a surface of the oxide; and
   directing light onto the passivated surface of the layer of oxide at areas to be etched, so as to depassivate the passivated surface and to etch the layer of oxide only at the surface receiving light.

16. A method of etching a layer of oxide as claimed in claim 15 wherein the step of providing the passivated etching solution includes providing an acid solution.

17. A method of etching a layer of oxide as claimed in claim 16 wherein the step of providing the acid solution includes providing an acid solution including one of HCl, $H_2SO_4$, $HNO_3$, and $HPO_3$.

18. A method of etching a layer of oxide as claimed in claim 17 wherein the step of providing the passivated etching solution containing HF includes providing a solution containing between 10–100 parts per million of HF.

19. A method of etching a layer of oxide as claimed in claim 15 wherein the step of providing the layer of oxide includes providing a layer of strontium titanate.

20. A method of etching a layer-of oxide as claimed in claim 15 wherein the step of directing light onto a surface of the layer includes directing collimated light onto the layer.

21. A method of etching a layer of oxide as claimed in claim 15 wherein the step of directing light onto a surface of the layer includes positioning a mask over portions of the layer which are not to be etched.

22. A method of etching a layer of oxide as claimed in claim 21 wherein the step of positioning the mask over portions of the layer which are not to be etched includes forming a hard mask on the surface of the layer.

23. A method of etching a layer of oxide as claimed in claim 21 wherein the step of positioning the mask over portions of the layer which are not to be etched includes focusing stepper light with a reticle mask.

24. A method of etching a layer of electrical insulating material comprising the steps of:
   providing a layer of strontium titanate on a surface of a semiconductor substrate;
   providing a passivated etching solution including an acid and less than 1000 parts per million of HF;
   immersing the layer of strontium titanate in the passivated etching solution whereby a surface of the layer of strontium titanate is passivated; and
   directing light onto the passivated surface of the layer of strontium titanate at areas to be etched, so as to depassivate the passivated surface of the strontium titanate and to etch the layer of strontium titanate only at the surface receiving collimated light.

25. A method of etching a layer of electrical insulating material as claimed in claim 24 wherein the step of providing the passivated solution including HP includes providing a solution containing acid and between 10–100 parts per million of HF.

26. A method of etching a layer of electrical insulating material as claimed in claim 24 wherein the step of directing light onto a surface of the layer includes directing collimated light onto the layer.

27. A method of etching a layer of electrical insulating material as claimed in claim 26 wherein the step of directing light onto a surface of the layer includes positioning a mask over portions of the layer which are not to be etched.

28. A method of etching a layer of electrical insulating material comprising the steps of:

providing a thin layer of strontium titanate on a surface of a semiconductor substrate;

providing a passivating solution including water and less than 1000 part per million of HE;

immersing the layer of strontium titanate in the passivating solution to passivate a surface of the strontium titanate;

providing a passivated etching solution including an acid and less than 1000 parts per million of HE;

immersing the layer of strontium titanate in the passivated etching solution; and directing light onto the passivated surface of the layer of strontium titanate at areas to be etched, so as to depassivate the passivated surface and to etch the layer of strontium titanate only at the surface receiving light.

29. A method of etching a layer of electrical insulating material as claimed in claim 28 wherein the step of providing the passivated etching solution including an acid and less than 1000 parts per million of HF includes providing a solution containing acid and between 10–100 parts per million of HF.

30. A method of etching a layer of electrical insulating material as claimed in claim 28 wherein the step of directing light onto a surface of the layer includes directing collimated light onto the layer.

31. A method of etching a layer of electrical insulating material as claimed in claim 28 wherein the step of directing light onto a surface of the layer includes positioning a mask over portions of the layer which are not to be etched.

* * * * *

UNITED STATES PATENT AND TRADEMARK OFFICE
CERTIFICATE OF CORRECTION

PATENT NO.    : 6,358,430 B1
DATED         : June 5, 2003
INVENTOR(S)   : Marshall et al.

It is certified that error appears in the above-identified patent and that said Letters Patent is hereby corrected as shown below:

<u>Column 5,</u>
Line 24, between "method" and "etching" insert -- of --.

<u>Column 7,</u>
Line 21, delete "HE" and insert -- HF --.

<u>Column 8,</u>
Line 3, delete "HE" and insert -- HF --.

Signed and Sealed this

Twenty-sixth Day of August, 2003

JAMES E. ROGAN
*Director of the United States Patent and Trademark Office*